United States Patent [19]
Fellman

[11] Patent Number: 4,598,422
[45] Date of Patent: Jul. 1, 1986

[54] HARMONIC TUNING SYSTEM FOR RADIO RECEIVERS

[75] Inventor: Daniel J. Fellman, Liverpool, N.Y.

[73] Assignee: General Electric Company, Portsmouth, Va.

[21] Appl. No.: 644,107

[22] Filed: Aug. 24, 1984

[51] Int. Cl.[4] ............................................. H04B 1/26
[52] U.S. Cl. ..................................... 455/180; 455/182; 455/186
[58] Field of Search ............... 455/166, 168, 180, 182, 455/185, 186, 195

[56] References Cited
U.S. PATENT DOCUMENTS 3,864,636  2/1975  Fukuda et al. ..................... 455/166
3,924,192 12/1975  George .
4,020,419  4/1977  Caspari et al. .

Primary Examiner—Jin F. Ng

[57] ABSTRACT

A harmonic tuning system for multi-band radio receivers in which reference and harmonic signals are generated and utilized in combination with the output frequency of a voltage controlled oscillator to produce control signals indicating tuning to unique radio frequencies. The control signals are utilized to control operation of the voltage controlled oscillator to reach and retain a desired radio frequency channel. Separate sets of reference signals are utilized for each broadcast band to enable the use of common control circuitry for tuning to the different broadcast bands.

15 Claims, 10 Drawing Figures

FIG. 2.
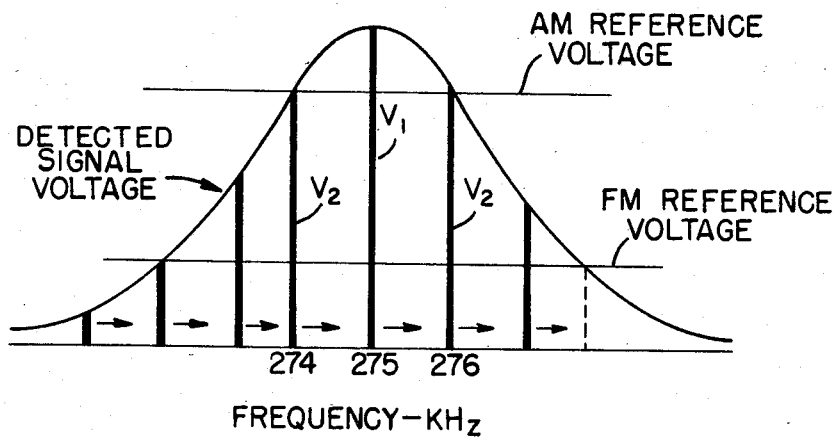
FIG. 3.
REFERENCE SIGNAL GENERATION
| MODE | REF. SIGNAL | LINE 86 | LINE 88 | OUTPUT FREQ. |
|---|---|---|---|---|
| AM | 1 ST. | 0 | 1 | 900 KHz |
| AM | 2 ND. | 1 | 1 | 20 KHz |
| FM | 1 ST. | 0 | 0 | 3.6 MHz |
| FM | 2 ND. | 1 | 0 | 100 KHz |
FIG. 8.
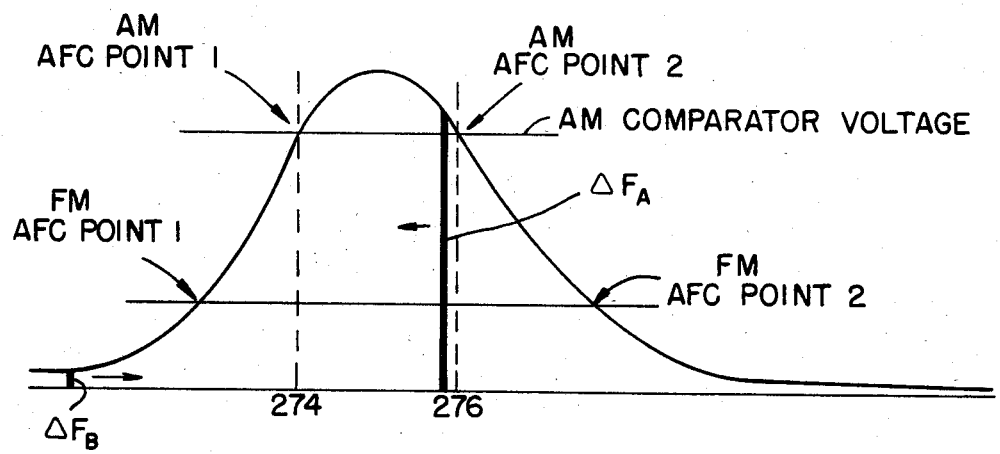

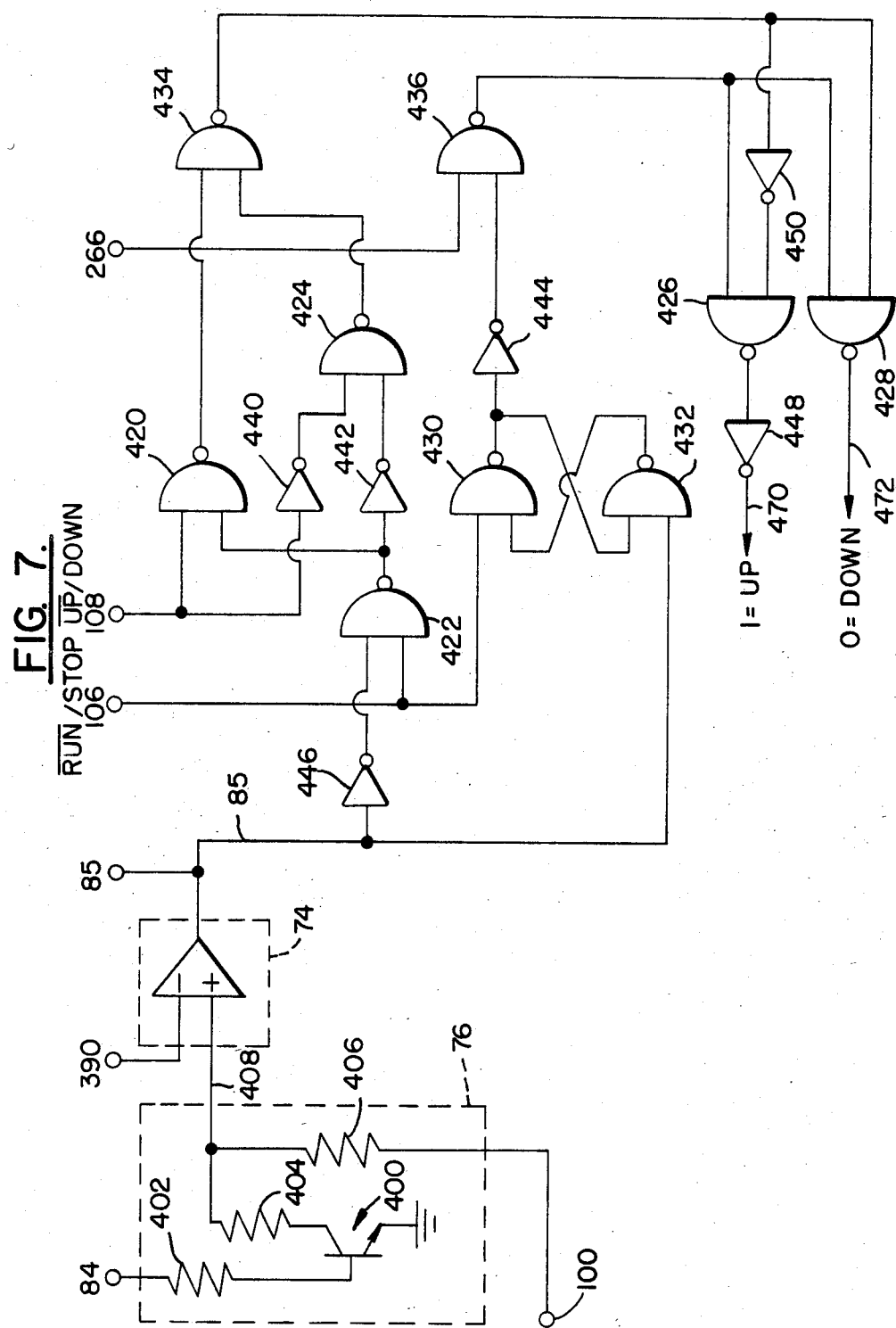

HARMONIC TUNING SYSTEM FOR RADIO RECEIVERS

BACKGROUND OF THE INVENTION

1. Field of the Invention

This invention relates to harmonic tuning for multiband radio receivers of the superheterodyne type and, more particularly, to a harmonic tuning system utilizing common control circuitry for rapid and accurate tuning to different radio frequency channels on the same and different broadcast bands.

2. Description of the Prior Art

Harmonic tuning systems have been known in the past for radio frequency apparatus such as television receivers, includng multi-band receivers. Such systems have been inherently one-way in tuning direction with minimal resolution. In particular, the prior art harmonic tuning systems have required the generation of harmonic signals at frequency spacings comparable to the frequency spacing between adjacent radio frequency channels and the use of intermediate frequencies less than the frequency difference between adjacent harmonic signals.

SUMMARY OF THE INVENTION

It is a primary object of this invention to provide an improved harmonic tuning system for radio receivers.

Another object of this invention is to provide a harmonic tuning system for multi-band radio receivers that utilizes common control circuitry for tuning to different radio frequency channels on the same and different broadcast bands.

Yet another object is to provide a harmonic tuning system for radio receivers in which tuning is accomplished through use of harmonic signals having spacings therebetween greater than the spacing between adjacent radio frequency channels for which the harmonic signals are used for tuning.

Still another object of the invention is to provide a harmonic tuning system in which a single intermediate frequency may be used for tuning to channels of different broadcast bands.

A still further object is to provide a harmonic tuning system having tuning resolution at one-half of the harmonic spacing.

Briefly stated, in carrying out the invention in a prefereed form, a radio receiver having radio circuity of the superheterodyne type is provided with harmonic tuning means including a voltage controlled local oscillator (VCO) coupled to the mixer of the radio receiver for supplying an output signal thereto at a variable frequency within a range of output frequencies required by the radio circuitry for tuning to a plurality of radio frequency channels within a particular broadcast band. The range of output frequencies of the VCO is offset from the range of frequencies of the broadcast band by a fixed intermediate frequency. A voltage supply means is coupled to the VCO for supplying voltage thereto within a voltage range which will cause the VCO to generate its output signal within the range of output frequencies. A reference and harmonic signal generating means is provided for selectively generating either first and second reference signals at first and second fixed frequencies, respectively, corresponding to the broadcast bands and a plurality of harmonic signals at frequencies that are multiples of the selected reference signal. A control signal generating means is coupled to both the VCO and the reference and harmonic signal generating means for a receiving the VCO output signal and the harmonic signals and generating a control signal wherever the frequency of the VCO output signal differs from one of the harmonic signals by a predetermined frequency that is greater than the maximum frequency difference between adjacent ones of the harmonic signals. The intermediate frequency, the first and second reference signals, and the predetermined frequency at which a control signal is generated are selected such that (1) a control signal is generated when the first reference signal is being generated and the radio receiver is tuned to a particular radio frequency channel within a central portion of the broadcast band, and (2) a control signal is generated when the second reference signal is being generated and the radio receiver is tuned to any one of a plurality of unique radio frequencies including at least every radio frequency channel within the broadcast band. The frequency difference between adjacent ones of the harmonic signals of the second reference signal is twice the frequency difference between adjacent ones of the unique radio frequencies. A control means having input means for establishing desired radio frequency channels is responsive to a desired radio frequency channel to sequentially (1) cause the reference and harmonic signal generating means to generate initially the first reference signal, (2) cause the voltage supply means to supply voltage to the VCO initially at a known voltage and thereafter vary the supply voltage in a predetermined direction to change the frequency of the VCO output signal within a central portion of the range of frequencies corresponding to the broadcast band, (3) upon receipt of the first central signal (a) utilize the first control signal as a marker representing actual tuning to the particular radio frequency within a central portion of the broadcast band, (b) cause the reference and harmonic signal generating means to generate the second reference signal, and (c) cause the voltage supply means to vary the supply voltage to the VCO in a direction to change the output frequency corresponding to the desired radio frequency channel, (4) utilize each subsequent control signal as a marker representing actual tuning to a respective unique radio frequency within the broadcast band, and (5) prevent in the absence of subsequent desired radio frequency channel further substantial change in the supply voltage to the VCO.

By a further aspect of the invention, the control means stores the value of the desired radio frequency channel, stores the value of the last tuned radio frequency channel, changes the stored value of the last tuned radio frequency channel to the next adjuacent radio frequency channel upon receipt of one or more control signals indicative of changed tuning to the next adjacent radio frequency channel, compares the values of the desired and last tuned radio frequency channels, and prevents further change of the supply voltage to the VCO when the last tuned radio frequency channel is the desire radio frequency channel. By a still further aspect of the invention, the control means is programmable, and the input means comprises manually operable means by which a user can select desired radio frequency channels.

In accordance with further aspects of the invention, the means for generating control signals includes detection means for producing a first voltage signal having maximum magnitude when the output signal is at the predetemined frequency and voltage reference means for generating a second voltage signal having a fixed magnitude corresponding to the broadcast band, the fixed magnitude being less than the maximum magnitude of the first voltage signal. A comparator receives the first and second voltage signals and produces a control signal whenever the output signal is at or within a predetemined range of the predetermined frequency. The control means varies the supply voltage to the VCO in an oscillatory mode to stablize tuning when a desired radio frequency channel has been attained.

In accordance with still further aspects of the invention, multiple VCO's are provided for multiple broadcast bands, and a unique set of references and harmonic signals is generated for each broadcast band. Specifically, in the AM mode, the frequency difference between adjacent harmonic signals of the second reference signal is twice the frequency difference between adjacent ones of the radio frequency channels in the AM broadcast band. In the FM mode, the frequency difference between adjacent harmonic signals of the second reference signal is one-half the frequency difference between adjacent ones of the radio frequency channels within the FM broadcast band.

BRIEF DESCRIPTION OF THE DRAWINGS

While the novel features of the invention are set forth with particularily in the appended claims, the invention, both as to organization and content, will be better understood and appreciated, along with other objects and features thereof, from the following:

FIG. 2 is a diagram illustrating the band pass characteristics of the harmonic tuning system;

FIG. 3 is a table identifying the reference signals supplied to the reference and harmonic signal generator in response to certain control inputs;

FIG. 7 is a schematic diagram of the voltage reference, comparator, and selected portions of the control circuit;

FIG. 8 is a view similar to FIGS. 4(a) and 4(b) illustrating AFC operation; and

DESCRIPTION OF A PREFERRED EMBODIMENT

Figure 1:
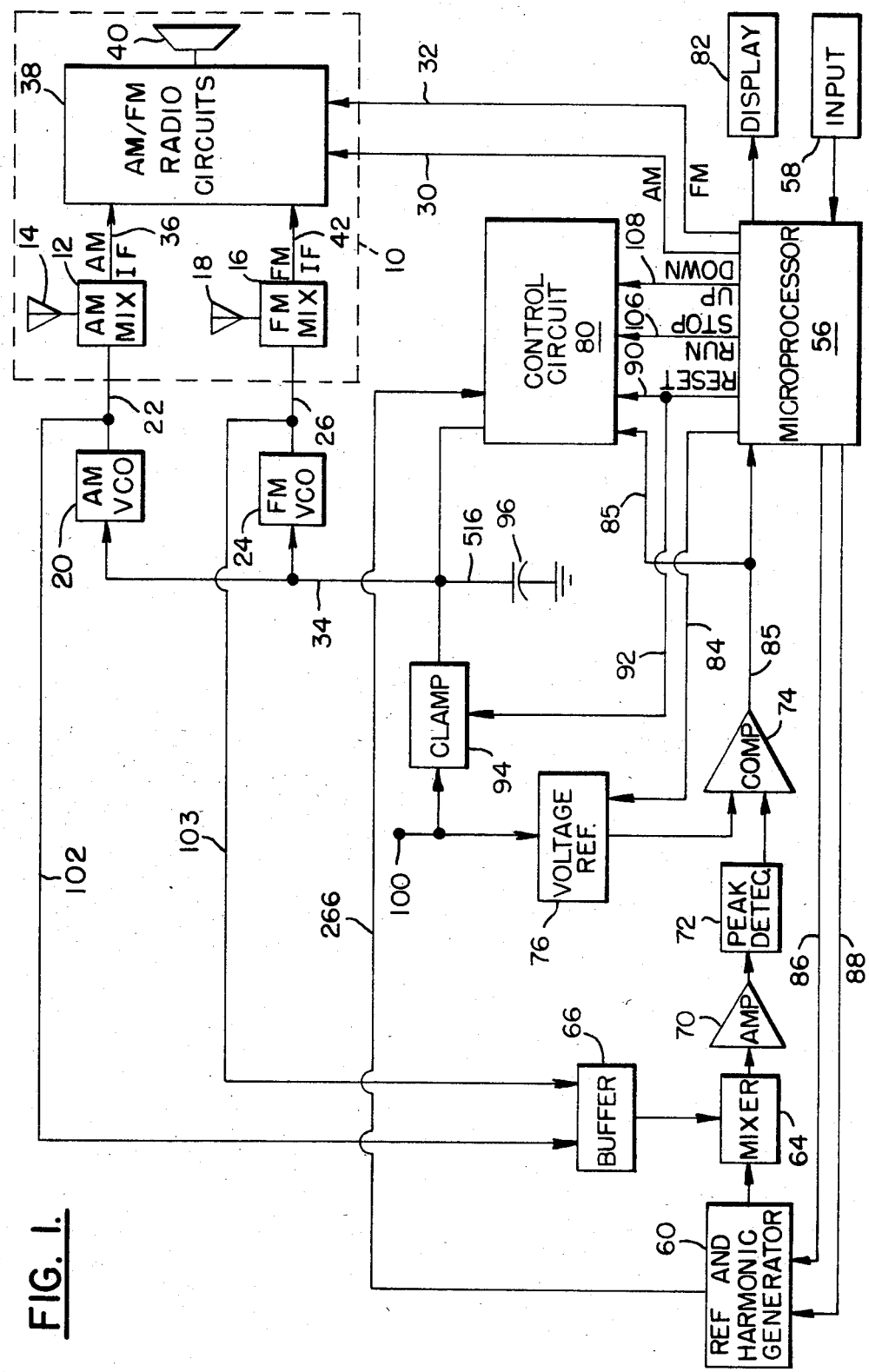
FIG. 1 is a schematic diagram of a multi-band radio receiver incorporating the harmonic tuning system of this invention.

Referring first to FIG. 1, a harmonic tuning system for an AM/FM radio receiver 10 of the superheterodyne type is illustrated in schematic form. The radio circuitry includes an AM mixer 12 for receiving from an antenna 14 amplitude modulated radio frequency signals in the frequency range of 535 to 1605 KHz, the AM broadcast band. The radio circuitry also includes an FM mixer 16 for receiving from an antenna 18 frequency modulated radio frequency signals in the frequency range of 88 to 108 MHz, the FM broadcast band. A voltage controlled oscillator 20 (VCO) is coupled to the AM mixer 12 for supplying thereto on line 22 an output signal having a frequency within the range of 990 to 2060 KHz. The output range of the VCO 20 is thus offset 455 KHz above the range of the AM broadcast band. Similarly, a VCO 24 is coupled to the FM mixer 16 for supplying thereto on line 26 an output signal having a frequency within the range of 98.675 to 118.675 MHz. The output range of the VCO 24 is thus offset 10.675 MHz above the range of the FM broadcast band.

Let it now be assumed that the radio receiver 10 has been enabled by a signal on line 30 to operate in the AM mode and that the VCO 20 is supplied over line 34 with a voltage that causes the VCO 20 to produce an output signal having a particular frequency, say 1455 KHz, within its output frequency range. Under these circumstances, the mixer 12 passes over its output line 36 to the radio circuits indicated generally by the numeral 38 not only the VCO output signal at 1455 KHz and all AM radio frequency signals received from the antenna 14, but also the sum and difference signals between the VCO output signal and the AM radio frequency signals. For example, if radio frequency signals are received at 990 KHz, 1000 KHz, and 1010 KHz, the signals transmitted from the mixer 12 over line 36 will include difference signals at 465 KHz (1455 KHz-990 KHz), 455 KHz (1455 KHz-1000 KHz), and 445 KHz (1450KHz-1010 KHz). It is well known in the radio art that a superheterodyne radio receiver includes in its radio circuits 38 filtering, amplifying and detection apparatus for extracting audio information from a single intermediate frequency signal, generally a signal at 455 KHz. In the present example, this means that the radio circuitry will extract and broadcast over a speaker 40 the audio information carried on the 455 KHz intermediate frequency, which is in this example the audio information carried on the 1000 KHz AM signal received by the antenna 14. The audio information on any other AM signal is suppressed since it is not carried on the 455 KHz intermediate frequency signal supplied by the mixer 12. If the voltage on line 34 is varied to change the VCO output signal on line 22, the speaker 40 will broadcast the audio information carried by the AM signal having a frequency 455 KHz less than the new frequency of the VCO output signal, e.g. a change of VCO output frequency to 1665 KHz will result in broadcast of the audio information carried by the AM signal at 1210 KHz (1665 KHz−1210 KHz=455 KHz).

Similarly, when the radio receiver 10 has been enabled by a signal on line 32 to operate in the FM mode, the radio circuitry 38 is adapted to amplify an intermediate frequency signal at 10.675 MHz. This means that the audio information broadcast over the speaker 40 will be that carried by the received FM signal that has a frequency that is 10.675 MHz less than the frequency of the output signal from the VCO 24.

For example, if the voltage on line 34 is such that the VCO output signal on line 26 has a frequency of 100.575 MHz, the audio information on the radio frequency signal at 89.9 MHz will be carried by the intermediate frequency signal at 10.675 MHz supplied over line 42. If the VCO output signal on line 26 is increased to 100.775 MHz, the audio information on the FM signal at 90.100 MHz will be supplied over line 42 and broadcast over the speaker 40.

The VCO 20 is designed such that the frequency of its output signal may be varied over its entire range by varying the input voltage supplied on line 34 over a fixed range, say one to seven volts. It is possible to tune to any desired radio frequency channel within the AM broadcast band by adjusting the voltage on line 34 to a corresponding value within the available voltage range. The VCO 24 is similarly designed such that the frequency of its output signal may be varied over its entire range by varying the input voltage on line 34 over the same fixed range. Any FM radio frequency channel may be tuned in by adjusting the voltage on line 34 to the corresponding value within this fixed voltage range. In this manner, tuning on both the AM and FM broadcast bands may be readily accomplished through the use of a single voltage source producing a single range of output voltages.

In accordance with the present invention, any desired radio frequency channel within a selected broadcast band can be tuned to by varying the voltage on line 34 until it reaches the level corresponding to the desired channel. Thereafter, the voltage on line 34 is maintained at the voltage level providing the desired radio frequency channel. Moreover, upon commencement of tuning, the voltage on line 34 is initially set to a substantially fixed level within a central portion of its full range, and the voltage is adjusted within the central portion of the full voltage range to tune in a particular channel, an initialization channel. Thereafter, the voltage on line 34 is adjusted upwardly or downwardly until the desired channel is reached. By thus starting the tuning process from a center portion of the voltage range, rather than from one extreme end of the range, the maximum tuning time is reduced.

The tuning system and concept of this invention will now be described in broad outline. Still referring to FIG. 1, the tuning apparatus includes a microprocessor 56 which is programmed to cause the voltage on line 34 to be adjusted in the manner described above in response to a selected broadcast band and a desired radio frequency channel within the selected band as entered into an input device such as a keyboard 58 by a user. To accomplish the tuning function, the microprocessor 56 causes a first reference signal related to the selected broadcast band to be generated by a reference and harmonic signal generator 60. Harmonics of the first reference signal are also generated by the reference and harmonic signal generator 60, and the first reference signal and all of its harmonic are then supplied to a mixer 64. The output signal of the VCO of the selected broadcast band is also supplied to the mixer 64 through a buffer 66. The mixer 64 produces output signals not only at the frequencies of its input signals, but also at frequencies that are the sums and differences of the input signals. The multiple signals from the mixer 64 are supplied to a tuned amplifier 70 and a peak detector 72, the peak detector 72 producing an output signal having a voltage proportional to the strength of the strongest signal supplied to it from the amplifier 70.

Referring now to FIGS. 1 and 2, the amplifier 70 has a relatively narrow pass band centered about a fixed frequency, which is 275 KHz in the illustrated embodiment of the invention. When a signal at 275 KHz is supplied to the amplifier 70 from the mixer 64, the signal is passed to the peak detector 76 at maximum voltage as indicated by the voltage V1 of FIG. 2. When a signal at either 274 KHz or 276 KHz is passed to the peak detector, its voltage V2 is substantially less due to the pass band characteristics of the amplifier 70. The detected voltages for signals spaced more than 1 KHz from the center frequency are still less. The peak detector 72 thus senses the maximum output voltage of the amplifier 70.

The output voltage signal from the peak detector 72 is supplied to a comparator 74 as a first voltage signal. A second continuous voltage signal is supplied to the comparator 74 from a voltage reference 76, the magnitude of the second voltage signal being established in accordance with the selected broadcast band as illustrated for the AM and FM bands by FIG. 2 and as described hereinafter. The second voltage signal from the voltage reference source 76 thus constitutes a reference voltage signal for the selected broadcast band. As shown by FIG. 2, the second or reference voltage signal is substantially higher for operation in the AM mode than it is for operation in the FM mode.

The comparator 74 produces and supplies to the microprocessor 56 a control signal whenever the magnitude of the first voltage signal from the peak detector 72 is equal to or greater than the second voltage signal from the voltage reference 76. When the AM broadcast band is selected, a control signal will be produced whenever the mixer 64 produces an output signal having a frequency within the approximate range of 274 to 276 KHz. When, however, operation is on the FM band, the reference voltage is substantially lower, and a control signal will be produced whenever the mixer 64 produces an output signal having a frequency within the range of 270 KHz to 280 KHz. Whenever the mixer 64 does not produce a signal within the required frequency range for the selected broadcast band, the comparator 74 does not produce an output control signal since the voltage detected by the peak detector 72 is less than the applicable reference voltage.

In accordance with the present invention, the microprocessor 56 and a control circuit 80 utilize control signals produced by the comparator 74 to precisely tune the radio receiver 10 to the desired radio frequency channel in the selected broadcast band. The general concept and operation of the invention will now be described in greater detail with reference to FIGS. 1-4. Following this general description, specific circuit arrangements for accomplishing various aspects of the invention will be described in greater detail.

Initially, let it be assumed that it is desired to tune the radio receiver 10 to a desired radio frequency channel, say 1020 KHz, on the AM broadcast band. This information is entered by the user on the keyboard or other input device 58, and the entered information is typically displayed under control of the microprocessor 56 on an appropriate output device 82 such as a digital display panel. The microprocessor 45 is programmed to indicate to other components of the system that the AM broadcast band has been selected. This is accomplished by the microprocessor 56 generating appropriate signals on line 30 to the radio circuits 38, line 84 to the voltage reference 76, and lines 86 and 88 to the reference signal generator 60. More particularly, the AM select signal on line 30 enables the AM operating mode of the radio circuits 38, the AM signal level on line 84 causes the voltage reference 76 to continuously supply the AM reference voltage (second voltage signal) to the comparator 74, and, as illustrated by FIG. 3, signals at logic levels 0 and 1 are supplied over lines 86 and 88, respectively, to the reference and harmonic signal generator 60 to cause it to generate a first reference signal at a frequency of 900 KHz. A reset signal is initially supplied over lines 90 and 92 to the control circuit 80 and a clamp circuit 94 to initialize the voltage supplied on line 34 to the VCO 20 and to start the tuning procedure. More particularly, in response to the reset signal, the clamp circuit 94 momentarily connects capacitor 96 and the line 34 to a source 100 of fixed voltage in the central portion of the voltage range of the VCO 20. In the illustrated embodiment of the invention, the voltage of the source 100 is approximately 3 volts, and the normal voltage range of the VCO's 20 and 24 for operation throughout their output frequency ranges is approximately one to seven volts. As a result, the momentary connection of the capacitor 96 to the source 100 causes the initial output frequency of the VCO 20 to be approximately 1350 KHz. Although this frequency is not sufficiently exact for precise tuning purposes, it is adequate to establish radio tuning to approximately 895 KHz (1350 KHz−455 KHz=895 KHz). This initial VCO output frequency of approximately 1350 KHz is supplied over line 102 to the buffer 66 and the mixer 64. The mixer 64 is also supplied with the first reference signal at a frequency of 900 KHz and its harmonic signals at higher frequencies. The mixer 64 supplies signals to the amplifier 70 at multiple frequencies including a signal at the difference frequency between the initial frequency of the VCO 20 and the frequency of the first harmonic of the first reference signal, or approximately 450 KHz (1800 KHz−1350 KHz). This signal is outside of the 274 KHz to 276 KHz effective pass band of the amplifier and, as a result, this signal does not cause the comparator 74 to initially produce a control signal on line 85. Nevertheless, this first signal at approximately 450 KHz and the signal at the difference frequency between the initial frequency of the VCO 20 and the frequency of the first reference signal (1350 KHz−900 KHz=450 Khz) are the only signals produced by the mixer 64 that are reasonably close to the 274 KHz to 276 KHz effective pass band of the amplifier 70.

In the absence of a control signal from the comparator 74, the microprocessor 56 is programmed to instruct the control circuit 80 over lines 106 and 108 to change gradually the voltage on line 34 in the upward direction to increase the output frequency of the VCO 20. The voltage on line 34 thereafter increases until the output frequency of the VCO 20 reaches 1526 KHz, at which time the difference signal from the mixer 64 resulting from the VCO output frequency and the first harmonic of the first reference signal (1800 KHz−1526 KHz) reaches the frequency, 274 KHz, required for the comparator 74 to produce a control signal on line 85. In response to this first control signal, the microprocessor 56 instructs the control circuit 80 over line 106 to stop varying the voltage on line 34, and the stored value of the desired radio frequency channel, 1020 KHz, is compared to the particular radio frequency channel (initialization frequency) to which the radio receiver is actually tuned, approximately 1070 KHz (1526 KHz−455 KHz), upon generation of the first control signal. In this case, the initialization and desired channels are not the same, and the microprocessor 56 stores the value of the last tuned radio frequency (1070 KHz in this example) and instructs the control circuits to proceed with the tuning procedure in the manner hereinafter described.

Following generation of the first control signal indicating the attainment of a known initialization frequency, the microprocessor 56 instructs the control circuit 80 over lines 106 and 108 to again vary the voltage on line 34 in the direction required to change the output frequency of the VCO 20 from the initialization frequency (1526 KHz) to the frequency required for the desired radio frequency channel. In the present example, the microprocessor 56 instructs the control circuit to decrease the voltage since the desired channel frequency of 1020 KHz (1475 KHz−455 KHz) is greater than the initialization frequency, or last tuned frequency. Simultaneously, the microprocessor 56 instructs the reference and harmonic signal generator 60 by means of logic signals of level 1 on both of lines 86 and 88 (FIG. 3) to generate a second reference signal at a frequency of 20 KHz and essentially all of its harmonics, e.g. a first harmonic signal at 40 KHz and a forty-fourth harmonic signal at 900 KHz. The forty-fourth harmonic is equal to the first reference signal in frequency (900 KHz) and, as a result, the forty-fourth harmonic and the output frequency of the VCO 20 will cause the comparator 74 to continue to generate the first control signal until the voltage on line 34 changes sufficiently to vary significantly the output frequency of the VCO 20.

Before proceeding with the description of the tuning process, it should be noted that radio frequency channels on the AM broadcast band are spaced at 10 KHz intervals throughout the range of the AM band, the lowest frequency channel being located at 540 KHz and the highest frequency channel being located at 1600 KHz with additional channels located therebetween at 10 KHz intervals. In accordance with the present invention, the harmonic signals of the second reference signal, which are spaced at 20 KHz intervals (twice the 10 KHz AM channel spacing), may be utilized to provide substantially exact tuning to each of the AM channels. In other words, harmonic signals at 20 KHz intervals are utilized to provide tuning at 10 KHz intervals. This important feature of the invention will be best understood with reference to FIG. 4. In parts of the world, AM channel spacings are provided at 9 KHz. In accordance with the invention, harmonic signals at 18 KHz intervals may be utilized in a similar manner to provide tuning at 9 KHz intervals.

Figure 4:
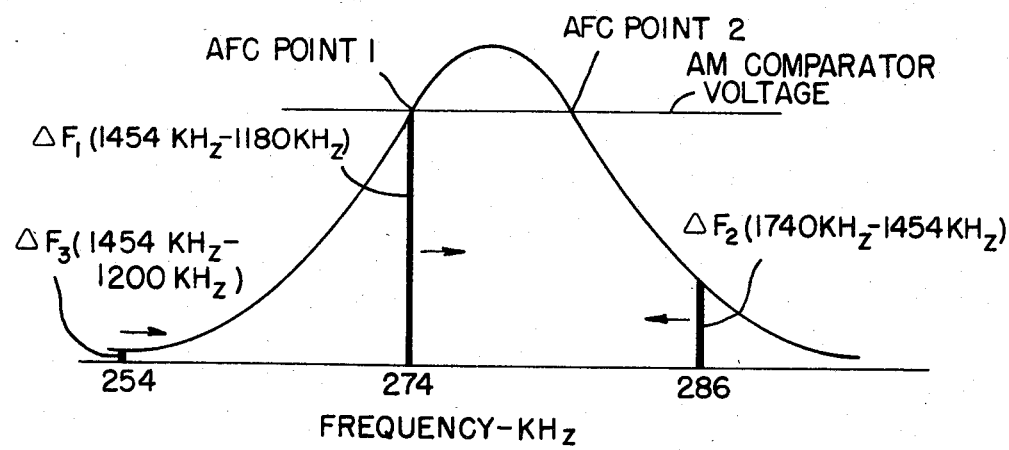
FIGS. 4(a) and 4(b) illustrate operation of the comparator in response to inputs thereto from the peak detector and the voltage reference.
Figure 4:
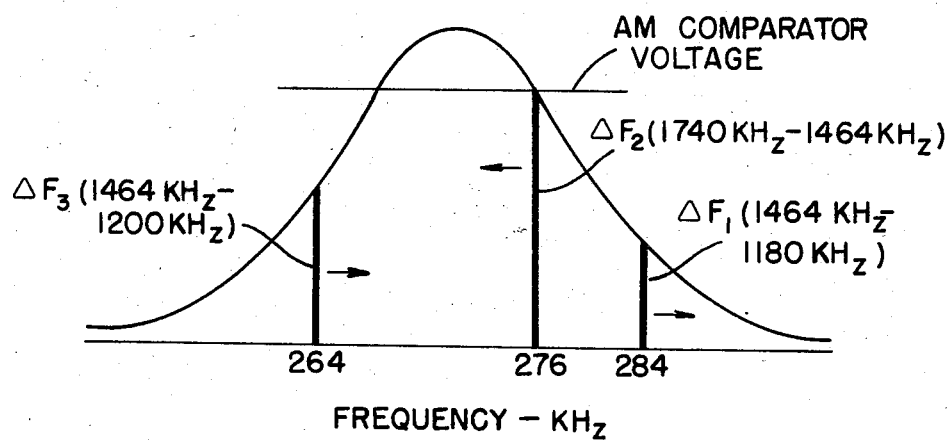

If, as illustrated by FIGS. 1 and 4, the VCO 20 is producing an output signal at 1454 KHz, the radio receiver 10 will be tuned within an error of one kilohertz to the AM channel at 1000 KHz (1454 KHz−455 KHz). The VCO output signal at 1454 KHz and the harmonic frequency at 1180 KHz will jointly cause the mixer 64 to produce a difference signal $\Delta F_1$ at 274 KHZ (1454 KHz−1180 KHz). This difference signal $\Delta F_1$ will cause the peak detector 72 to produce an output voltage, as illustrated by FIG. 4(a), equal to the reference voltage signal supplied by the voltage reference 76. As a result, the comparator 74 produces a control signal when the radio receiver is tuned to 1000 KHz. Simultaneously, other difference signals, such as $\Delta F_2$ and $\Delta F_3$, are generated by the mixer 64, but the voltages of these difference signals are not sufficient to cause the generation of a control signal by the comparator 74. It will be noted, however, that the difference signal $\Delta F_2$ is produced at a frequency of 286 KHz due to the difference between the VCO frequency of 1454 KHz and the harmonic signal at 1740 KHz. Similarly, the difference signal $\Delta F_3$ is produced at a frequency of 254 KHz due to the difference between the VCO frequency of 1454 KHz and the harmonic signal at 1200 KHz.

Still referring to FIGS. 1 and 4(a), let it now be assumed that the voltage on line 34 is increased sufficiently to cause the frequency of the output signal from VCO 20 to increase to 1455 KHz. When this occurs, the difference signal $\Delta F_1$ will have a frequency of 275 KHz (1455 KHz−1180 KHz) and the difference signals $\Delta F_2$ and $\Delta F_3$ will have respective frequencies of 285 KHz and 255 KHz. An increase in the voltage on line 34 thus causes the difference signals $\Delta F_1$, $\Delta F_2$, and $\Delta F_3$ to shift in the directions indicated by the arrows in FIG. 4(a). When the voltage on line 34 has increased sufficiently to cause the frequency of the output signal from the VCO 20 to reach 1457 KHz, the difference signal $\Delta F_1$ will have a frequency of 277 KHz, and a control signal will no longer be generated by the comparator 74 since the voltage magnitude of the signal $\Delta F_1$ will no longer be equal to or greater than the AM reference voltage signal. At this instant, the difference signal $\Delta F_1$ is moving to the right away from the effective 274–276 KHz band pass of the comparator 74 while the difference signals $\Delta F_2$ and $\Delta F_3$ are approaching the effective band pass from the right and left, respectively. This continues until, as illustrated by FIG. 4(b), the output frequency of the VCO 20 has increased by 10 KHz to 1464 KHz, at which time the difference signal $\Delta F_2$ is 276 KHz (1440 KHz − 1464 KHz), thus causing the generation of another control signal by the comparator 74. Similarly, $\Delta F_3$ will cause the generation of the next control signal when the output frequency from the VCO 20 reaches 1474 KHz. In this manner, the harmonic signals at 20 KHz intervals provide control signals at 10 KHz intervals, the same as the spacing of the AM radio frequency channels. This result is possible because the effective band pass frequency of the comparator 74 is greater than the frequency difference between adjacent ones of the harmonic signals. As a result, the difference signals $\Delta F_1$, $\Delta F_2$ etc. alternately approach the band pass from the right and left and thus provide tuning accuracy at one-half of the harmonic spacing.

Returning now to the description of the tuning process with the radio receiver 10 tuned to the frequency of 1070 KHz, the microprocessor 56 instructs the control circuit 80 over lines 106 and 108 to vary the voltage on line 34 in the direction required to change the output frequency of the VCO 20 from its initialization frequency (1525 KHz) to the frequency (1475 KHz) required for the desired radio frequency channel (1020 KHz). In this case, the voltage on line 34 is decreased. In accordance with the above description, a new control signal will be generated by the comparator 74 as a result of each 10 KHz increase in the output frequency of the VCO 20. Specifically, a second control signal will be generated when the output frequency of the VCO 20 reaches 1515 KHz to tune the radio receiver 10 to the next radio frequency channel at 1060 KHz. The control circuit 80 then operates in an automatic frequency control mode to essentially hold the voltage on line 34 constant, stores the value of the newly tuned channel, and the desired and actual (newly tuned) radio frequency channels are again compared. If they are not identical, the microprocessor 56 causes the tuning process to proceed, and comparisons of the actual and desired frequency channels are made at each 10 KHz interval until the desired radio frequency channel is reached.

When the desired radio frequency channel is reached, the microprocessor 56 stops the tuning process. Thereafter, the microprocessor 56 operates in an automatic frequency control mode to keep the radio receiver 10 tuned to the desired radio frequency channel until a new desired channel is entered into the input device 58. The details of the automatic frequency control mode will be described hereinafter.

When a new desired radio frequency channel within the AM broadcast band is entered into the input device 58, the entire tuning process is repeated until the new desired channel is reached. Specifically, a reset signal is supplied over lines 90 and 92 to again initialize the voltage supplied to the VCO 20, and the first reference signal is again produced by the reference and harmonic signal generator 60. Once the initialization frequency is reached, the second reference signal is produced by the reference and harmonic signal generator 60, and tuning proceeds in the manner described above until the new desired channel is reached.

Let it now be assumed that a new desired radio frequency channel, say 100.1 MHz, within the FM broadcast band is entered into the input device 58 by the user. In this case, the microprocessor 56 is programmed to instruct the radio circuits 38 by line 32, the voltage reference 76 by line 84, and the reference and harmonic signal generator 60 by lines 86 and 88 that the FM band has been selected. More particularly, the FM select signal on line 32 enables the FM operating mode of the radio circuits 38, the FM signal level on line 84 causes the voltage reference 76 to continuously supply the FM reference voltage (FIG. 2) to the comparator 74, and, as illustrated by FIG. 3, signals at logic levels 0 and 0 are supplied over lines 86 and 88, respectively, to the reference signal generator 60 to cause it to generate a first reference signal at a frequence of 3.6 MHz. A reset signal is initially supplied over lines 90 and 92 to the control circuit 80 and the clamp circuit 94 to initialize the voltage supplied on line 34 to the VCO 24 and start the tuning procedure. The voltage on line 34, as in the AM tuning case, is initialized at approximately 3 volts to cause the initial output frequency of the VCO 24 to be approximately 106 MHz. As in the AM case, this frequency is not sufficiently exact for precise tuning purposes, but it is adequate to establish radio tuning to approximately 95.325 MHz (106 MHz − 10.675 MHz = 95.325 MHz). This initial VCO output frequency of approximately 106 MHz is supplied over line 102 to the buffer 66 and the mixer 64, which is also supplied with the first reference signal at a frequency of 3.6 MHz and its harmonic signals at higher frequencies, including the twenty-ninth harmonic at 104.4 MHz and the thirtieth harmonic at 108 MHz. The mixer 64 supplies signals to the amplifier 70 at multiple frequencies including the difference frequencies between the initial frequency of the VCO 24 and each of the frequencies of the first reference signal and its harmonics. These difference signals include the signal produced by the VCO output frequency and the twenty-ninth harmonic (106 MHz − 104.4 MHz = 1.6 MHz) and the signal produced by the VCO output frequency and the thirtieth harmonic (108 MHz − 106 MHz = 2 MHz). These signals are the nearest to the operative pass band, 270 KHz to 280 KHz, of the amplifier 70 in the FM mode as illustrated by FIG. 2, but they are clearly outside of the pass band and, as a consequence, a control signal is not generated by the comparator 74.

As the voltage on line 34 increases, however, the output frequency of the VCO 24 also increases, and the difference signal resulting from the VCO output signal and the thirtieth harmonic decreases to approach the pass band of the amplifier 70. When the frequency of the VCO output signal reaches 107.72 MHz, the difference signal is 280 KHz (108 MHz − 107.72 MHz), and a control signal will be generated to indicate that an FM initiatization frequency of approximately 97.05 MHz (107.725 MHz−10.675 MHz) has been reached. In response to the first control frequency, the microprocessor 56 supplies over lines 86 and 88 signals of logic levels 1 and 0, respectively, to cause the reference and harmonic signal generator 60 to generate a second reference signal at a frequency of 100 KHz. The reference and harmonic signal generator 60 also produces harmonics of this signal at 100 KHz intervals. Initially, the 1,080th harmonic (1080×100 KHz=108 MHz) of the second reference signal has the same frequency as the thirtieth harmonic of the first reference signal, and the first control signal continues to be generated. As the VCO voltage increases, however, the difference signal falls outside of the pass band, and the first control signal is no longer generated. As in the AM case described above, second control signals will be generated as the VCO voltage increases, and tuning will progress in this manner until the desired radio frequency channel is reached.

The spacing of the harmonics at 100 KHz intervals assures that second control signals will be generated at 50 KHz intervals. Thus, four second control signals will be generated as the tuning progresses through each 200 KHz wide FM channel. The microprocessor 56 is programmed to recognize that four control signals indicate the passage of each FM channel. This particular arrangement is also applicable for tuning over the FM band in those countries where FM channels are spaced by 50 KHz rather than 200 KHz. If it is only desirous to tune to FM channels at 200 KHz intervals, harmonics spaced at 200 KHz intervals may be used.

Figure 5:
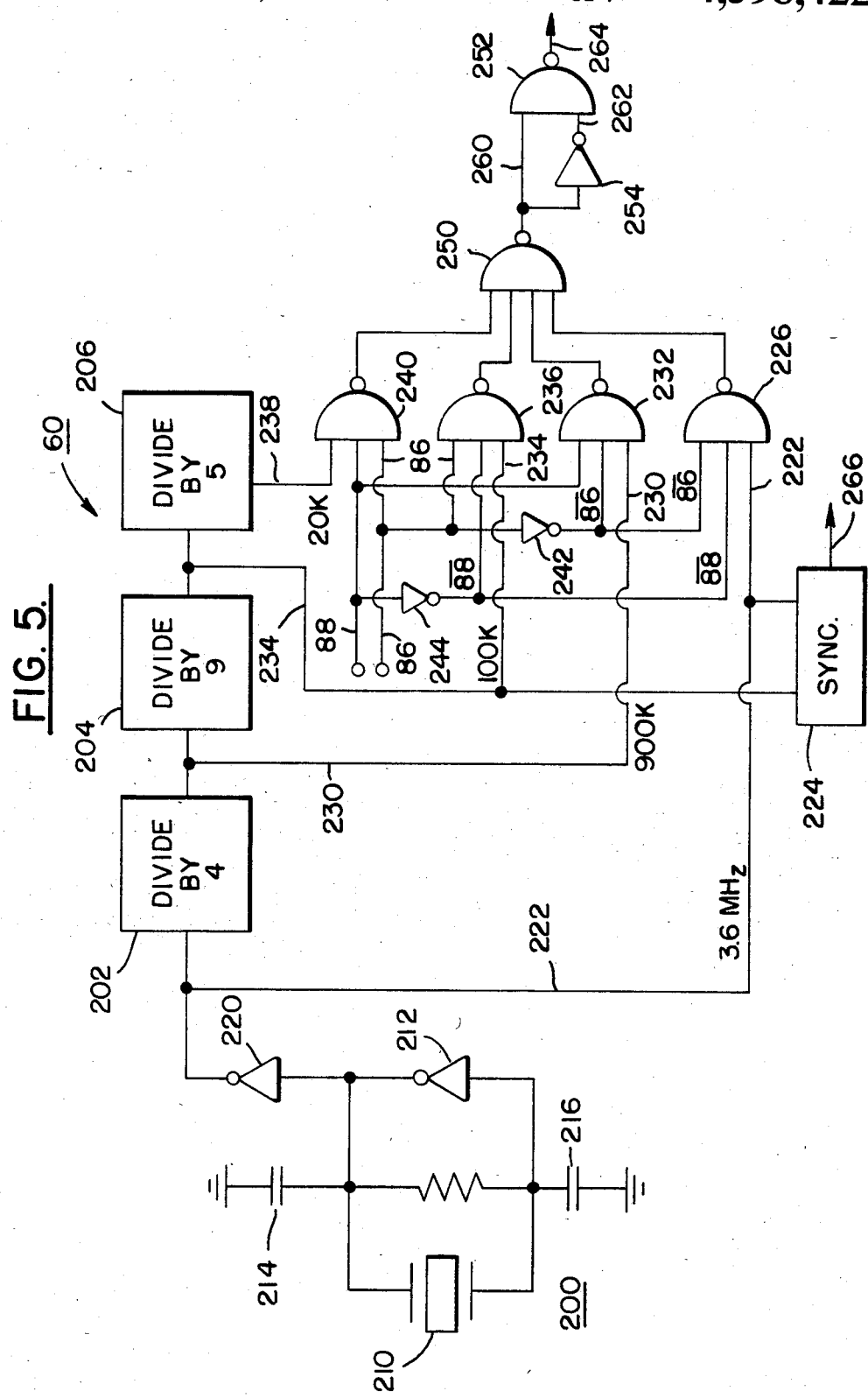
FIG. 5 is a schematic diagram of the reference and harmonic signal generator.

Referring now to FIG. 5, a preferred embodiment of the reference and harmonic signal generator 60 is illustrated in schematic form. The frequency generator 60 includes a master frequency generator 200 coupled to a series connection of divider circuits 202, 204, and 206. The master frequency generator 200 includes a 3.6 MHz ceramic crystal 210 which is connected in parallel with an inverting operational amplifier 212 having a resistive feedback path coupled between its output and its input. Grounded capacitor filters 214 and 216 are coupled to the input and output terminals of the operational amplifier 212. The output signal provided by the operational amplifier 212 is coupled to the input of a second operational amplifier 220. The output of the second operational amplifier 220 is coupled to the first divider circuit 202 to supply an input signal thereto at a substantially constant frequency of 3.6 MHz. The 3.6 MHz output signal of the master frequency generator 200 is also supplied over line 222 to a synchronizer 224 and to a NAND gate 226. The divider circuit 202 provides a divide-by-four function, and its output is connected to divider circuit 204 to supply an input signal thereto at 900 KHz (3.6 MHz÷4). The 900 KHz output signal of the divider circuit 202 is also supplied over line 230 to a NAND gate 232. The divider circuit 204 provides a divide-by-nine function, and its output is connected to the divider circuit 206 to supply an input signal thereto at 100 KHz (900 KHz÷9). The 100 KHz output signal of the divider circuit 204 is also supplied over line 234 to both the synchronizer 224 and to a NAND gate 236. The divider circuit 206 provides a divide-by-five function to supply over line 238 an input signal at 20 KHz (100 KHz÷5) to a NAND gate 240. Line 86 from the microprocessor 56 (see FIG. 1) is coupled directly to second inputs of the NAND gates 236 and 240 and, through an inverter 242, to second inputs of the NAND gates 226 and 232. Similarly, line 88 from the microprocessor 56 is coupled directly to second inputs of the NAND gates 232 and 240 and, through an inverter 244, to second inputs of the NAND gates 226 and 236. The outputs of the NAND gates 226, 232, 236, and 240 are coupled to the inputs of a NAND gate 250, whose output is coupled directly over line 260 to a first input of a NAND gate 252. The output of the NAND gate 250 is also coupled through an inverter 254 and line 262 to a second input of the NAND gate. The output from the NAND gate 252 is the reference signal and its harmonics.

Let it now be assumed that it is desired to generate a reference signal at 3.6 MHz. In such a case, it is known from FIG. 3 that constant signals at the 0 level must be present on lines 86 and 88. Since at least one input to each of the gates 232, 236 and 240 is thus continuously held at the 0 level, the output from each of these gates will be held constant at the 1 level. With respect to gate 226, however, the inverters 242 and 244 hold two inputs thereto continuously at the 1 level. The third input is connected to line 222 and is thus supplied with a signal at 3.6 MHz alternating between the 0 and 1 logic levels. When the signal on line 222 is at the 0 level, the output from the NAND gate 226 will be at the 1 level, and when the signal on line 222 is at the 1 level, the output from the NAND gate 226 will be at the 0 level. When the input to the NAND gate 250 from the NAND gate 226 is at the 0 level, the output from the NAND gate 250 is at the 1 level. When the input from the NAND gate 226 is at the 1 level, the output from the NAND gate 250 is at the 0 level. The output from the NAND gate 250 thus alternates between the 0 and 1 levels with the durations of the 0 and 1 levels being approximately equal.

When the output of the NAND gate 250 over line 260 has been at the 1 level for a substantial period of time, the output of the inverter 254 over line 262 is at the 0 level. Under these conditions, the output from the NAND gate 252 on line 264 is at the 1 level. When the output of the NAND gate 250 goes to the 0 level, the gate delay of the inverter 254 assures that for a short period of time signals at the 0 level will be present on both lines 260 and 262; the output of the NAND gate 252 on line 262 will remain at the 1 level. Immediately thereafter, the output on line 262 goes to the 1 level, and again there is no change in the 1 output level of the NAND gate 252 on line 264. When, however, the output of the NAND gate 250 changes from the 0 level to the 1 level, signals at the 1 level will be present on both of lines 260 and 262 for a period equal to the gate delay of the inverter 254. For this short period only, the output of the NAND gate 252 will be at the 0 level. Thereafter, the output of the inverter 254 and line 262 will change to the 0 level, and the output of the NAND gate 252 on line 264 will revert to the 1 level. As a result, the output signal at 3.6 MHz from the NAND gate 250 having 0 and 1 levels of approximately equal duration is converted by the NAND gate 252 and the inverter 254 into an output signal at 3.6 MHz from the NAND gate 252 having alternating 1 and 0 levels, the 1 levels being of substantially long relative duration and the 0 levels being of substantially short relative duration.

The foregoing provides a description of the manner by which a reference signal at 3.6 MHz is generated. Similarly, reference signals at 900 KHz, 100 KHz, and 20 KHz will be generated when the signals on lines 86 and 88 are held at the levels specified by FIG. 3. In each case,, the reference signal produced on line 264 will be of a pulse nature having relatively long 1 levels followed by short 0 levels. Such pulse tones are extremely rich in harmonic signals. As a result, the output signal on line 264 comprises not only the appropriate reference signal, but also its harmonics.

As indicated previously, the 3.6 MHz signal on line 222 and the 100 MHz signal on line 234 are both supplied to the synchronizer 224, which include appropriate flip-flop elements to produce an output signal on line 266 at 100 MHz having a short duty cycle synchronized to the 3.6 MHz signal. More particularly the 100 KHz signal on line 266 has a short duration 0 level followed by a relatively long duration 1 level. Detailed circuitry for the synchronizer 224 and the divider circuits 202, 204 and 206 have not been described since such circuitry is well known and can be readily provided by persons skilled in the art.

Figure 6:
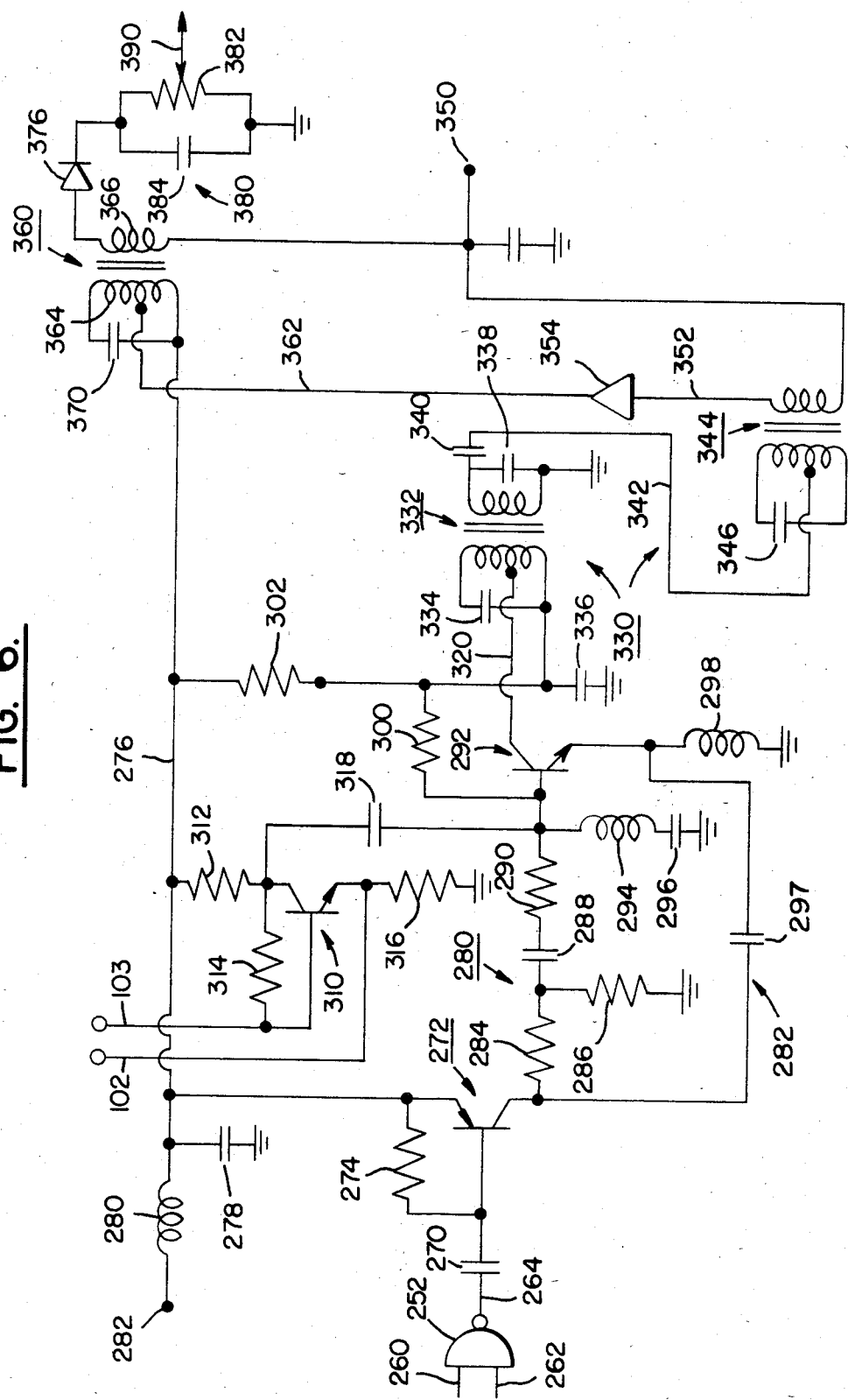
FIG. 6 is a schematic diagram of the buffer, mixer, amplifier, and peak detector.

Referring now to FIG. 6, the output line 264 of the NAND gate 252 of FIG. 5 is coupled through an AC coupling capacitor 270 to a pulse shaping circuit comprising a transistor 272 and a resistor 274 coupled between the emitter and base of the transistor 272. The emitter of the transistor 272 is coupled to a power bus 276, which is coupled by means of a filter capacitor 278 and an inductor 280 to a source 282 of d.c. voltage. The collector of the transistor 272 is coupled to a first harmonic path indicated generally by 280 and a second harmonic path indicated generally by 282. The function of the pulse shaping circuit comprising the transistor 272 is to sharpen the shape of the reference and harmonic signals supplied over line 264 by decreasing the rise and fall times of the pulses.

The first harmonic path circuit 280 includes a voltage divider comprising resistors 284 and 286, the output of which is coupled through an AC coupling capacitor 288 and a resistor 290 to the base of a transistor 292. The base of the transistor 292 is also coupled to ground through a filter circuit comprising an inductor 294 and a capacitor 296. The second harmonic path circuit includes a capacitor 297 coupled to the collector of the transistor 272 and the emitter of the transistor 292. An inductor 298 is coupled between the emitter of the transistor 292 and ground. A current limiting resistor 300 couples the base of the transistor 292 through a resistor 302 to the power bus 276. The function of the first harmonic path circuit 280 is to deliver the relative low frequency harmonic signals utilized for AM tuning to the transistor 292, and the function of the second harmonic path circuit 282 is to deliver the relatively high frequency harmonic signals utilized for FM tuning to the transistor 292. The voltage divider comprising the resistors 284 and 286 reduces the strength of the harmonic signals passed by the circuit 280 to a level comparable to the level of the harmonic signals passed by the circuit 282. The filter comprising the inductor 294 and the capacitor 296 is tuned to filter out harmonic signals in the vicinity of 275 KHz to assure that a harmonic signal of approximately 275 KHz will not mistakenly be interpreted as a difference signal as described with respect to FIG. 4.

As shown by FIGS. 1 and 6, the output signals from the AM and FM VCO's 20 and 24 are delivered over lines 102 and 103, respectively, and are coupled through a buffer 66, comprising transistor 310 of FIG. 6, to the base of the transistor 292. More particularly, the collector of the transistor 310 is coupled to the power bus 276 by a current limiting resistor 312, and a resistor 314 is coupled between the collector and the base of the transistor 310. A resistor 316 is coupled between the emitter of the transistor 310 and ground. The output signal on line 102 from the AM VCO 24 is coupled to the emitter of the transistor 310, and the output signal on line 103 from the FM local oscillator is coupled to the base of the transistor 310. The output of the transistor 310 is provided at its collector and is coupled through a capacitor 318 to the base of the transistor 292 to supply the VCO output signals thereto. The transistor 292 comprises the mixer 64 and produces at its collector a wide band of output signals including all its input signals and sum and difference signals resulting from the input signals. These signals are delivered over line 320 to a two stage filter indicated generally by the numeral 330.

The mixer output on line 320 is coupled to the center tap of the primary winding of a first stage transformer 332 of the filter 330, the primary winding of the transformer 332 having a capacitor 334 coupled across its terminals. One of the terminals of the primary winding is also coupled to ground through a capacitor 336 and to the power bus 276 through the resistor 302. The secondary of the transformer 332 has a grounded capacitor 338 coupled across its output terminals. The secondary of the transformer 332 is also coupled through a capacitor 340 over line 342 to the center tap of the primary winding of a second stage transformer 344, the primary of transformer 344 having a capacitor 346 coupled across its terminals. One oupu terminal of the secondary winding of the transformer 344 is coupled to a source 350 of constant d.c. voltage, and the other output terminal of the secondary winding is coupled over line 352 through conventional amplifying means 354 to a pulse shaping circuit indicated generally by the numeral 360. The two stage filter 330 and the amplifying means 354 together comprise the block 70 labeled amplifier in FIG. 1. The components of the two stage filter 330 are selected to provide a pass band centered at 275 KHz. The signals passed by the two stage filter are of relatively small magnitude and are amplified by the amplifying means 354 as more particularly described in connection with FIG. 7.

Still referring to FIGS. 1 and 6, the amplified output of the amplifying means 354 is supplied over line 362 to a pulse shaping circuit 360. The circuit 360 comprises a transformer 360 including a primary winding 364 and a secondary winding 366. A band limiting capacitor 370 is connected across the end terminals of the primary winding 364, and the line 362 from the amplifying means 354 is coupled to a center tap of the primary winding 364. The secondary winding 366 has a first terminal coupled to the source 350 of d.c. voltage and to the secondary winding of transformer 344 and a second terminal coupled through a diode detector 376 to a reference level circuit 380 comprising a parallel connection of a grounded potentiometer 382 and a grounded capacitor 384. An output signal from the potentiometer 382 is provided on line 390. The function of the circuit 360 is to restore the shape of the amplified signals passed by the amplifying means 354, and the diode detector 376 and the reference level circuit 380 form the peak detector 72 of FIG. 1 for producing an output signal on line 390. The output signal on line 390 is supplied to the comparator 74, and the strength of the output signal on line 390 is significant only when the peak detector is supplied with signals in the vicinity of 275 KHz.

With reference to FIGS. 1 and 7, the voltage reference 76 comprises a transistor 400 and resistors 402, 404, and 406. Line 84 from the microprocessor 56 is coupled through the resistor 402 to the base of the transistor 400. The resistors 406 and 404 are connected in series between the collector of the transistor 400 and the source 100 of fixed d.c. voltage, approximately 3 volts. The emitter of the transistor 400 is grounded. When it is desired to operate in the AM mode, the signal on line 84 is insufficient to turn on the transistor 400, and as a result the input voltage on line 408 to the comparator 74 is held at the voltage of source 100, approximately 3 volts. When it is desired to operate in the FM mode, the signal on line 84 is sufficient to turn on the transistor 400, and the input voltage on line 408 to the comparator 74 is held at the voltage of source 100 less the drop across the resistor 406. The voltage on line 408 during FM operation is typically held to approximately 2.5 volts. As previously described with respect to FIG. 6, the voltage on line 390 reflects the strength of the strongest difference signal detected by the peak detector 72. If the strongest signal is within the desired pass band for the selected broadcast mode, the signal level on line 390 will exceed the signal level on line 408 and the comparator 74 will produce a control signal, a signal having a low, or 0, output. Otherwise, the comparator output will be high, or 1. The control output signal from the comparator 74 is supplied over lines 85 to the microprocessor 56 and the control circuit 80, a portion of the control circuit 80 being illustrated by FIG. 7.

Still referring to FIGS. 1 and 7, the control circuit 80 includes the illustrated digital logic network. The network includes conventional NAND gates 420, 422, 424, 426, 428, 430, 432, 434 and 436, and inverters 440, 442, 444, 446, 448, and 450 interconnected as illustrated. The output line 85 of the comparator 74 is coupled to one input of the NAND gate 422 through an inverter 446 and to one input of a flip-flop comprising NAND gates 430 and 432; as indicated above, the control signal output on line 85 is at the 0 level when a difference signal within the pass band of the amplifier 70 is present and at the 1 level when a difference signal of sufficient strength is not present on line 390. The Run/Stop output line 106 from the microprocessor 56 is coupled to the other input of the NAND gate 422 and to the other input of the flip-flop comprising gates 430 and 432. The signal level on line 106 is 1 when Stop is authorized and 0 when Run is authorized. The Up/Down output line 108 from the microprocessor 456 is coupled to one input of the NAND gate 420 and to the inverter 440. The signal level on line 108 is 1 when Down scanning is authorized and 0 when Up scanning is authorized. The 100 KHz signal on line 266 (see FIGS. 1 and 5) is coupled to the NAND gate 436.

The operation of the digital logic network will now be described with reference to FIGS. 1, 7 and 8. Let it be assumed that the comparator 74 is producing an output signal of level 0 on line 85 because of the presence of difference signal Δ Fa within the pass band of the amplifier 70, that a RUN signal of level 0 is present on line 106, and that an UP signal of level 0 is present on line 108. Furthermore, it will be noted that alternating signal levels of 0 and 1 are present on line 266. As a result of these inputs, the digital logic network of FIG. 7 produces output signals of level 1 on both of lines 470 and 472. As will become more obvious from the subsequent description of FIG. 9, this combination of output signals on lines 470 and 472 will cause the voltage to increase on line 34 to increase the output frequency of the VCO 20. This will cause Δ Fa to shift to the left and Δ Fb to shift to the right as viewed in FIG. 8. There will, however, be no changes in the inputs to the digital logic network of FIG. 7 until the signal Δ Fa moves to the left of AFC Point 1 and causes the output signal from the comparator 74 on line 85 to shift from the 0 level to the 1 level. As a result of this change, there will be no immediate change in the output signals on lines 470 and 472. The voltage on line 34 will continue to increase. Line 85 is, however, also coupled to the microprocessor 56, which is programmed to respond to the generation of a signal of level 1 on line 85 by generating a STOP signal of level 1 on line 106. Again, there is no immediate change in the output signals on lines 470 and 472.

When, however, the signal Δ Fb reaches 274 KHz (actually slightly exceeds 274 KHz by moving slightly to the right of 274 KHz as viewed by FIG. 8), the output signal from the comparator 74 will shift from the 1 level to the 0 level. When this occurs, the input levels of 0, 1, and 0 on lines 85, 106 and 108, respectively, and the alternating short duration 0 and long duration 1 levels on line 266 will result in an output level of 0 on line 470 and alternating output levels of 0 and 1 on line 472. As a result, the voltage on line 34 will decrease slowly (decreases only when the output on line 472 are 0) to shift the signal Δ Fb to the left back toward 274 KHz. When the signal Δ Fb drops below 274 KHz, the signal on line 85 will again go to 1, and the result will be alternating output levels of long duration 0 and short duration 1 on line 470 and an output level of 1 on line 472. As a result, the voltage on line 34 will increase slowly to shift the signal Δ Fb upward toward 274 KHz again. Operation will continue in this automatic frequency control (AFC) mode until another RUN signal is generated by the microprocessor 56 on line 106. Absent the generation of another RUN signal, the voltage on line 34 will be alternately increased and decreased in this manner to hold the difference signal at 274 KHz, or AFC Point 1.

When the difference signal Δ Fb first reaches AFC Point 1, the output signal from the comparator 74 is supplied to the microprocessor 46 over line 85. The microprocessor 56 under its program control determines if the sensed control signal represents the desired radio frequency tuning. If it does, the microprocessor will not generate another RUN signal, and the voltage on line 34 will be continually adjusted as described above to keep the signal Δ Fb at AFC Point 1. If, however, the microprocessor 56 determines that the signal Δ Fb does not represent the desired radio frequency, another RUN signal of level 0 will be generated on line 106. As a result, operation will be as described above, and the voltage on line 34 will be increased relatively rapidly since the output signal on line 470 will be a constant 1 until the difference signal Δ Fb reaches 276 KHz. When this occurs, AFC operation will take place as described above, and the signal Δ Fc will be stabilized at AFC Point 2.

It may, however, be desirable to stabilize all of the difference signals about a single AFC point, say AFC Point 1, to provide more accurate tuning. This can be accomplished by programming the microprocessor 56 to continue to generate an UP signal of 0 level after a difference signal has reached AFC Point 1 from the left and to generate a DOWN signal of 1 level after a difference signal has reached AFC Point 2 from the right. This will cause all of the difference signals to be stabilized about AFC Point 1. When it is desired to continue scanning in the UP direction, an UP signal of level 0 must be supplied over line 108 from the microprocessor. Similarly, stabilization about AFC Point 2 can be accomplished by generating a DOWN signal of 1 level after a difference signal has reached AFC Point 1 from the left and generating an UP signal of 0 level after a difference signal has reached AFC Point 2 from the right.

From the foregoing, it will be obvious to those skilled in the art that tuning in the downward direction may be provided in the foregoing manner by providing a DOWN signal of level 1 on line 108. It will also be obvious that the digital logic network is equally applicable to AM and FM tuning. It should be noted, however, that the program controlling the microprocessor must be programmed when operating in the AM mode to recognize each control signal on line 85 as representing passage of a single radio frequency channel and when operating in the FM mode to recognize each control signal on line 85 as representing passage of one-quarter of a single radio frequency channel (or passage of a single frequency in many parts of the world). Such modifications in the controlling program will be readily apparent to those skilled in the art.

Persons skilled in the art will be able to program the microprocessor 56 to perform the control functions described herein. Various modifications may be made to accommodate the characteristics of specific systems. For example, as described herein, the microprocessor 56 is programmed to generate a STOP signal of level 1 on line 106 immediately following generation of a signal of level 1 on line 85. As a result AFC operation occurs as soon as the signal level on line 85 changes back to level 0. If desired, generation of the STOP signal may be delayed for a predetermined period less than the normal duration of signal level 1 on line 85. In this manner, the possibility that noise on line 85 will be interpreted as a new level 0 signal will be greatly reduced. Moreover, if the microprocessor 56 is capable of responding fast enough, the generation of a STOP signal on line 106 may be delayed until after the generation of a new 0 level signal on line 85. Other programming modifications will be readily apparent to those skilled in the art.

In a preferred embodiment, the microprocessor 56 is a microprocessor selected from the 6500 microprocessor family available from Commodore-MOS Technology, Norristown, PA, or Synertek Systems, Santa Clara, Calif. More particularly, it is recognized that the 6512 microprocessor having 4K address capability is sufficient to satisfy the software needs of the present invention.

Figure 9:
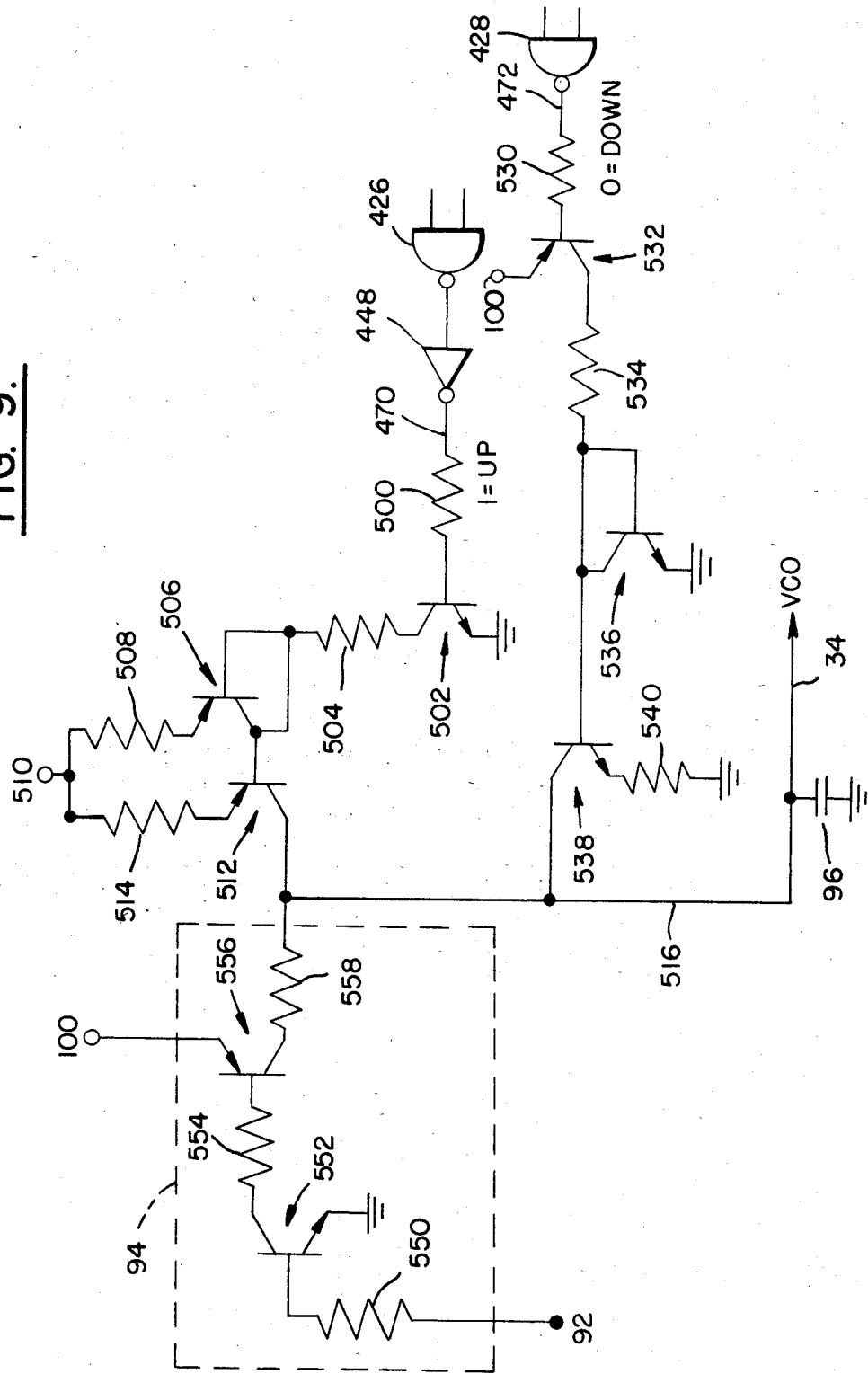
FIG. 9 is a schematic diagram showing the clamp circuit and selected portions of the control circuit.

Referring now to FIGS. 1, 7 and 9, regulation of the VCO control voltage on line 34 by the digital logic network of FIG. 7 will be described. The line 470 from the inverter 448 is connected through a resistor 500 to the base of a transistor 502. The emitter of the transistor 502 is grounded, and the collector of the transistor 502 is connected through a resistor 504 to both the base and the collector of a transistor 506. The emitter of the transistor 506 is connected through a resistor 508 to a source 510 of constant d.c. voltage. The collector of the transistor 506 is also connected to the base of a transistor 512. The emitter of the transistor 512 is coupled through a resistor 514 to the d.c. source 510. The collector of the transistor 512 is connected through line 516 to the capacitor 96 and the line 34 to the VCO's 20 and 24. This circuitry comprises a current source which supplies substantially constant current through line 516 to the capacitor 96 and the line 34 to the VCO's when a signal level of 1 is present on line 470 from the logic network. As a result, the voltage on line 34 increases, and the output frequencies of the VCOs increase when the current source is operative. When the signal level on line 470 is 0, the current source is inoperative.

The line 472 from the NAND gate 428 is connected through a resistor 530 to the base of a transistor 532. The emitter of the transistor 532 is connected to the source 100 of d.c. voltage at approximately 3 volts. The collector of the transistor 532 is coupled through a resistor 534 to both the base and the collector of a transistor 536. The emitter of the transistor 536 is connected to ground. The resistor 534 is also connected to the base of a transistor 538. The collector of the transistor 538 is connected to the line 516, and the emitter of the transistor 538 is coupled through a resistor 540 to ground. This circuitry comprises a current drain which draws substantially constant current through the line 516 from the capacitor 96 when a signal level of 0 is present on line 472 from the logic network. As a result, the voltage on line 34 to the VCOs decreases, and the output frequencies of the VCOs decrease when the current drain is operative. When the signal level on line 472 is 1, the current drain is inoperative.

The reset function and clamp circuitry 94 will now be described. The reset line 92 from the microprocessor 56 is coupled through a resistor 550 to the base of a transistor 552. The emitter of the resistor 552 is connected to ground, and the collector of the transistor 552 is coupled through a resistor 554 to the base of a transistor 556. The emitter of the transistor 556 is connected to the 3 volt source 100 of d.c. electric power, and the collector of the transistor 556 is coupled through a small current limiting resistor 558 and line 516 to the capacitor 96 and line 34 to the VCOs. When it is desired to initiate tuning, a reset signal of level 1 is supplied through line 92 to the clamp circuit 94. This signal causes the transistors 552 and 556 to turn ON and thereby rapidly charge the capacitor 96 to the voltage of the d.c. source 100. The resulting voltage on the capacitor 96 is transmitted through line 34 to the VCOs to reset their output frequencies to a middle portion of their range. From this established starting point, tuning can proceed as described above.

From the foregoing, it will be seen that this invention provides harmonic tuning for multi-band radio receivers of the superheterodyne type utilizing common control circuitry for rapid and accurate tuning to different radio frequency channels on the same and different broadcast bands.

As described herein, each time a new desired radio frequency channel is identified, the voltage on line 34 is initialized at approximately 3 volts, and the voltage on line 34 is thereafter varied in the appropriate direction to reach the desired radio frequency channel. It would be relatively easy for persons skilled in the art to modify the program and structure to provide various alternative technique. For example, if speed of tuning is not essential, the intial voltage on line 34 could be initially established at either the maximum or minimum voltage within the voltage range to the VCOs 20 and 24 with the voltage thereafter varied in a single fixed direction to reach any desired radio frequency channel. Similarly, when operation has been established at one radio frequency channel and another channel is subsequently selected, there is no necessity that the entire tuning process be reinstated. Instead, the microprocessor 56 may be readily programmed to remember the current radio frequency channel and count from there to the desired radio frequency channel. Moreover, if speed of tuning is essential, an additional reference signal may be used for generating harmonics at intervals that will provide skipping of channels during the initial scanning, e.g. stepping to every fourth channel rather than to every channel in AM and every one-fourth channel in FM. These and other alternatives will be readily apparent to persons skilled in the art.

While the invention has been particularly shown and described with reference to a preferred embodiment thereof, it will be understood by those skilled in the art that various changes in form, details, and application may be made therein without departing from the spirit and scope of the invention. Accordingly, it is intended that all such modifications and changes be included within the scope of the appended claims.

What is claimed as new and is desired to secure by Letters Patent is:

1. In a radio receiver having radio circuitry of the superheterodyne type, harmonic tuning means comprising:
   (a) a voltage controlled local oscillator (VCO) coupled to the mixer of the radio receiver for supplying an output signal thereto at a variable frequency within a range of output frequencies required by the radio circuitry for tuning to a plurality of radio frequency channels within a particular broadcast band, said range of output frequencies being offset from the range of frequencies of the broadcast band by a fixed intermediate frequency,
   (b) voltage supply means coupled to said VCO for supplying voltage thereto within a voltage range which will cause said VCO to generate said output signal within said range of output frequencies,
   (c) reference and harmonic signal generating means for selectively generating either first and second reference signals at first and second fixed frequencies, respectively, corresponding to the broadcast band and a plurality of harmonic signals at frequencies that are multiples of the selected reference signal,
   (d) control signal generating means coupled to both said VCO for receiving therefrom said output signal and said reference and harmonic signal generating means for receiving therefrom said harmonic signals, said control signal generating means generating a control signal whenever the frequency of said VCO output signal differs from one of said harmonic signals by substantially a predetermined frequency, said predetermined frequency being greater than the maximum frequency difference between adjacent ones of said harmonic signals,
   (e) said intermediate frequency, said first and second reference signals, and said predetermined frequency at which a control signal is generated being preselected such that:
      (i) a first control signal is generated when the first reference signal is being generated and the radio receiver is tuned to a particular radio frequency channel within a central portion of the broadcast band, and
      (ii) a second control signal is generated when the second reference signal is being generated and the radio receiver is tuned to any one of a plurality of unique radio frequencies including at least every radio frequency channel within the broadcast band, the frequency difference between adjacent ones of said harmonic signals of said second reference signal being twice the frequency difference between adjacent ones said unique radio frequencies,
   (f) control means coupled to said reference and harmonic signal generating means, said voltage supply means, and said control signal generating means, and
   (g) input means coupled to said control means for establishing desired radio frequency channels,
   (h) said control means being responsive to a desired radio frequency channel established by said input means to sequentially:
      (i) cause said reference and harmonic signal generating means to generate initially said first reference signal,
      (ii) cause said voltage supply means to supply voltage to said VCO initially at a substantially known voltage and thereafter vary the supply voltage in a predetermined direction to change the frequency of the VCO output signal within a central portion of the range of frequencies corresponding to the broadcast band,
      (iii) upon receipt of the first control signal from said control signal generating means, (1) utilize the first control signal as a marker representing actual tuning to said particular radio frequency within a central portion of the broadcast band, (2) cause said reference and harmonic signal generating means to generate said second reference signal, and (3) cause said voltage supply means to vary the supply voltage to said VCO in a direction to change the output frequency of said VCO output signal toward the frequency corresponding to the desired radio frequency channel,
      (iv) utilize each subsequent control signal as a marker representing actual tuning to a respective unique radio frequency within the broadcast band, and
      (v) prevent in the absence of a subsequent desired radio frequency channel further substantial change of the supply voltage to said VCO upon receipt of the control signal corresponding to the desired radio frequency channel.

2. Harmonic tuning means as defined by claim 1 in which the broadcast band is the FM band and the frequency difference between adjacent harmonic signals of the second reference signal is one-half the frequency difference between adjacent ones of the radio frequency channels within the FM broadcast band marked by the control signals.

3. Harmonic tuning means as defined by claim 1 for a radio receiver in which said control means is programmable and in which said input means comprises manually operable means by which a user can select desired radio frequency channels.

4. Harmonic tuning means as defined by claim 1 for a radio receiver in which said control signal generating means comprises:
   (a) means for producing output signals at frequencies representing the frequency differences between the output signal from said VCO and each of the harmonic signals from said harmonic signal generating means, and
   (b) means coupled to said means for producing output signals for sensing an output signal at said substantially predetermined frequency and generating in response thereto a control signal.

5. Harmonic tuning means as defined by claim 4 for a radio receiver in which said means for generating a control signal comprises:
   (a) detection means coupled to said means for producing output signals for generating in response to an output signal a first voltage signal having a magnitude related to the frequency of the output signal, said first voltage signal having a symmetrical waveform characterized by maximum magnitude when said output signal is at said substantially predetermined frequency and decreasing magnitude with increasing departure from said substantially predetermined frequency,
   (b) voltage reference means coupled to said control means for generating a second voltage signal having a fixed magnitude corresponding to the broadcast band, said fixed magnitude of said second voltage signal being less than the maximum magnitude of said first voltage signal, and
   (c) comparator means coupled to said detection and voltage references means for receiving therefrom said first and second voltage signals and producing a control signal whenever said first voltge signal is equal to or greater than said second voltage signal, whereby a control signal is produced whenever said output signal is at or within a predetermined range of said substantially predetermined frequency.

6. Harmonic tuning means as defined by claim 5 for a radio receiver in which said control means prevents further substantial changes of the supply voltage to said VCO upon receipt of the control signal corresponding to the desired radio frequency channel by causing said voltage supply means to continuously vary in an oscillatory mode the voltage applied to said VCO, said voltage being:
   (a) varied in a direction to reduce the first voltage signal when the control signal corresponding to the desired radio frequency channel is being generated, and
   (b) varied in a direction to increase the first voltage signal when the control signal corresponding to the desired radio frequency channel is not being generated,
   (c) whereby the magnitude of said first voltage signal oscillates about the magnitude of said second voltage signal to stabilize tuning of the radio receiver to the desired radio frequency channel.

7. Harmonic tuning means as defined by claim 1 in which the broadcast band is the AM band and the frequency difference between adjacent harmonic signals of the second reference signal is twice the frequency difference between adjacent ones of the radio frequency channels within the AM broadcast band.

8. In a radio receiver having radio circuitry of the superheterodyne type capable of receiving a plurality of broadcast bands, harmonic tuning means comprising:
   (a) control means,
   (b) input means coupled to said control means for selecting a broadcast band and establishing a desired radio frequency channel within the selected broadcast band,
   (c) a plurality of voltage controlled local oscillators (VCO) each coupled to a mixer of the radio receiver for supplying an output signal thereto at a variable frequency within a range of frequencies required by the radio circuitry for tuning to a plurality of radio frequency channels within a respective one only of the broadcast bands, said range of output frequencies being offset from the range of frequencies of the broadcast band by a fixed intermediate frequency,
   (d) voltage supply means coupled to all of said VCO's for supplying voltage thereto within a single voltage range which will cause each of said VCO's to generate its output signal within the range of output frequencies required for tuning across the respective one only of the broadcast bands,
   (e) reference and harmonic signal generating means for selectively generating either first and second reference signals at first and second fixed frequencies, respectively, corresponding to the selected one of the broadcast bands and a plurality of harmonic signals at frequencies that are multiples of the selected reference signal, and
   (f) control signal generating means coupled to both the VCO of the selected one of the broadcast bands for receiving therefrom said output signal and said reference and harmonic signal generating means for receiving therefrom said harmonic signals, said control signal generating means generating a first control signal whenever the frequency of said VCO output signal differs from one of said harmonic signals by substantially a predetermined frequency, said predetermined frequency being greater than the maximum frequency difference between adjacent one of said harmonic signals,
   (g) said intermediate frequencies of the plurality of broadcast bands, said first and second reference signal corresponding to each of said plurality of broadcast bands, and said predetermined frequency at which a control signal is generated being preselected such that:
      (i) a control signal is generated when the first reference signal corresponding to the selected broadcast band is being generated and the radio receiver is tuned to a particular radio frequency channel within a central portion of the selected broadcast band, and
      (ii) a control signal is generated when the second reference signal corresponding to the selected broadcast band is being generated and the radio receiver is tuned to unique radio frequencies including at least every radio frequency channel within the selected broadcast band, the frequency difference between adjacent ones of said adjacent ones of the harmonic signals of said second reference signal being twice the frequency difference between adjacent ones of said unique radio frequencies.
   (h) said control means coupled to said reference and harmonic signal generating means, said voltage supply means, and said control signal generating means, and said control means responsive to a desired radio frequency channel established by said input means to:
      (i) cause said reference and harmonic signal generating means to generate initially said first reference signal corresponding to the selected broadcast band,
      (ii) cause said voltage supply means to supply voltage to the VCO of the selected one of the broadcast bands initially at a substantially known voltage and thereafter vary the supply voltage in a predetermined direction to change the frequency of the VCO output signal within a central portion of the range of frequencies corresponding to be selected broadcast band, (iii) upon receipt of the first control signal from said control signal generating means, (1) utilize the first control signal as a marker representing actual tuning to said particular radio frequency within a central portion of the selected broadcast band, (2) cause said reference and harmonic signal generating means to generate said second reference signal, and (3) cause said voltage supply means to vary the supply voltage to said VCO in a direction to change the output frequency of said VCO output signal toward the frequency corresponding to the desired radio frequency channel within the selected broadcast band, (iv) utilize each subsequent control signal as a marker representing actual tuning to a respective unique radio frequency within the selected broadcast band, and (v) prevent in the absence of a subsequent desired radio frequency channel further substantial change of the supply voltage to said VCO upon receipt of the control signal corresponding to the desired radio frequency channel.

9. Harmonic tuning means as defined by claim 8 for a radio receiver in which said control signal generating means comprises:

(a) means for producing output signals at frequencies representing the frequency differences between the output signal from the VCO of the selected one of the broadcast bands and each of the harmonic signals from said harmonic signal generating means, and (b) means coupled to said means for producing output signals for sensing an output signal at said substantially predetermined frequency and generating in response thereto a control signal.

10. Harmonic tuning means as defined by claim 9 for a radio receiver in which said means for generating a control signal comprises:

(a) detection means coupled to said means for producing output signals for generating in response to an output signal a first voltage signal having a magnitude related to the frequency of the output signal, said first voltage signal having a symmetrical waveform characterized by maximum magnitude when said output signal is at said substantially predetermined frequency and decreasing magnitude with increasing departure from said substantially predetermined frequency, (b) voltage reference means coupled to said control means for generating a second voltage signal having a fixed magnitude corresponding to the selected broadcast band, said fixed magnitude of second voltage signal being less than the maximum magnitude of said first voltage signal, (c) and comparator means coupled to said detection and voltage reference means for receiving therefrom said first and second voltage signals and producing a control signal whenever said first voltage signal is equal to or greater than said second voltage signal, whereby a control signal is produced whenever said output signal is at or within a predetermined range of said substantially predetermined frequency.

11. Harmonic tuning means as defined by claim 10 for a radio receiver in which said control means prevents further substantial changes of the supply voltage to said VCO upon receipt of the control signal corresponding to the desired radio frequency channel by causing said voltage supply means to continuously vary in an oscillatory mode the voltage applied to said VCO, said voltage being:

(a) varied in a direction to reduce the first voltage signal when the control signal corresponding to the desired radio frequency channel is being generated, and (b) varied in a direction to increase the first voltage signal when the control signal corresponding to the desired radio frequency channel is not being generated, (c) whereby the magnitude of said first voltage signal oscillates about the magnitude of said second voltage signal to stabilize tuning of the radio receiver to the desired radio frequency channel.

12. Harmonic tuning means as defined by claim 11 for a radio receiver in which said control means:

(a) stores the value of the desired radio frequency channel, (b) stores the value of the last tuned radio frequency channel, (c) changes the stored value of the last tuned radio frequency channel to the next adjacent radio frequency channel upon receipt of one or more control signals indicative of changed tuning to said next adjacent radio frequency channel, (d) compares the values of the desired and last tuned radio frequency channels, and (e) prevents further substantial change of the supply voltage to said VCO when the last tuned radio frequency channel is the desired radio frequency channel.

13. Harmonic tuning means as defined by claim 12 in which the predetermined frequency difference at which control signals are generated is substantially greater than the frequency differences between adjacent harmonic signals of the second reference signal.

14. Harmonic tuning means as defined by claim 13 in which the selected broadcast band is the AM band and the frequency difference between adjacent harmonic signals of the second reference signal is twice the frequency difference between adjacent ones of the unique radio frequencies within the AM broadcast band marked by the control signals.

15. Harmonic tuning means as defined by claim 13 in which the selected broadcast band is the FM band and the frequency difference between adjacent harmonic signals of the second reference signal is one-half the frequency difference between adjacent ones of the unique radio frequencies within the FM broadcast band marked by the control signals.

* * * * *